US005969648A

United States Patent [19]

Garnett

[11] Patent Number: 5,969,648

[45] Date of Patent: Oct. 19, 1999

[54] QUATERNARY SIGNAL ENCODING

[75] Inventor: Paul Jeffrey Garnett, Merseyside, United Kingdom

[73] Assignee: Sun Microsystems, Inc., Mountain View, Calif.

[21] Appl. No.: 08/882,554

[22] Filed: Jun. 25, 1997

[51] Int. Cl.[6] .................. H03M 5/20

[52] U.S. Cl. .................. 341/56

[58] Field of Search .................. 341/56; 326/59, 326/60; 338/92, 95, 200, 201, 123, 126, 128

[56] References Cited

U.S. PATENT DOCUMENTS

| | | | |
|---|---|---|---|
| 4,016,483 | 4/1977 | Rudin | 338/92 |
| 4,373,152 | 2/1983 | Jacobsthal | 341/56 |
| 4,408,135 | 10/1983 | Yuyama et al. | 326/60 |

FOREIGN PATENT DOCUMENTS

| | | | |
|---|---|---|---|
| 61-281745 | 12/1986 | Japan | 341/56 |

OTHER PUBLICATIONS

Weiss, Binary–Quaternary Encoder–Decoder, IBM Technical Disclosure Bulletin vol. 12, No. 1, Jun. 1989 p. 22.

*Primary Examiner*—Howard L. Williams

*Attorney, Agent, or Firm*—Blakely Sokoloff Taylor & Zafman

[57] ABSTRACT

An apparatus and method enables inputs based on a quaternary encoding having high, pulled-up, pulled down and low signal values. The high and low values can be derived from low impedance connections to high and low potential sources, respectively, and the pulled-up and pulled-down signal values can be derived from higher impedance connections to the high and low potential sources, respectively. Discrimination of the first and second levels is performed in two phases. In a first phase a signal level at an input is detected. In a second phase the input is driven towards the inverse of the level detected in the first phase and the level is detected once more. A change in level indicates a high impedance connection to the potential source corresponding to the signal level detected in the first phase. No change indicates a low impedance connection to the potential source corresponding to the signal level detected in the first phase. In this manner four input levels for an input can be discriminated using binary level discriminating circuitry.

32 Claims, 5 Drawing Sheets

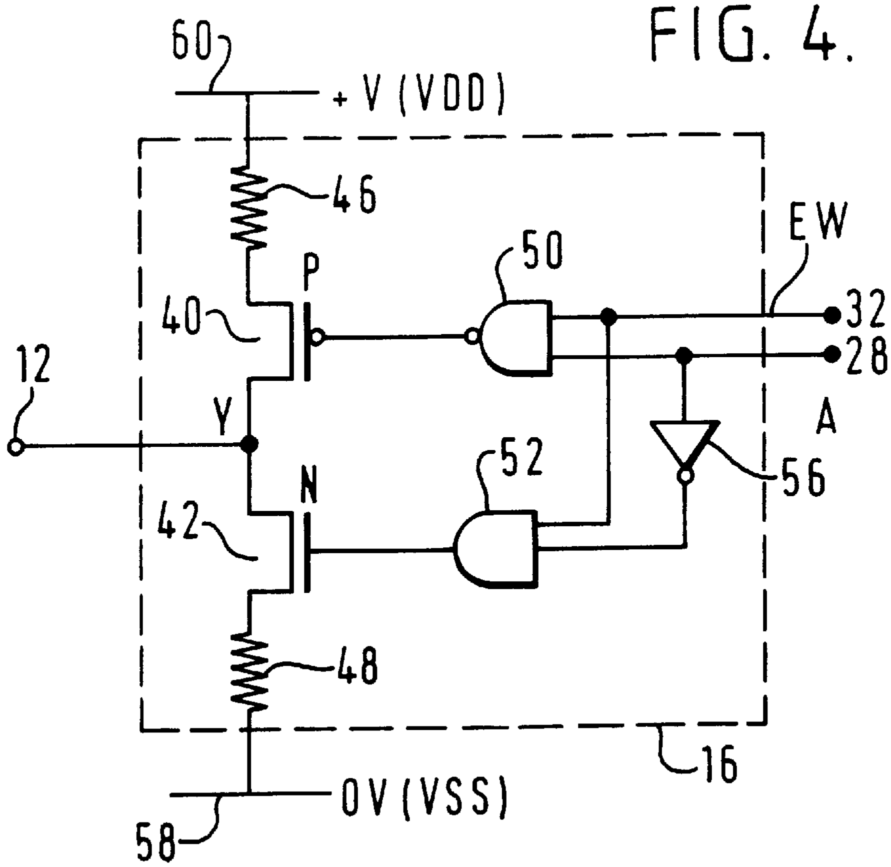
FIG. 4.
FIG.5.
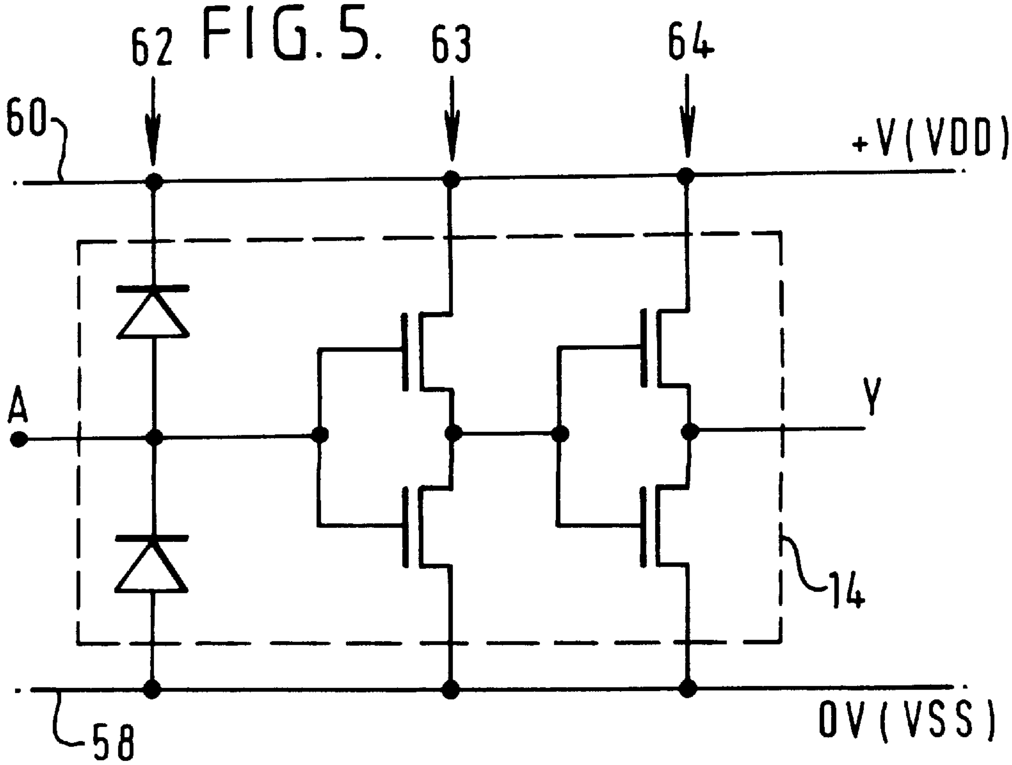

QUATERNARY SIGNAL ENCODING

BACKGROUND AND INTRODUCTION

This invention relates to signal encoding apparatus and methods.

In many digital systems, different configurations are required, wherein the particular configuration needs to be sensed by the digital system. If a large number of configurations is required, a binary encoding may be used where the number of options available is $2^N$, wherein N is the number of pins used. As the name suggests, binary systems have only two possible values per pin (usually high and low).

Often, configuration options for hardware are encoded using jumpers, the number of options being determined by the number of option pins. Often the number of pins available on an integrated circuit is at a premium due to cost and/or functionality requirements.

Three level (trinary or tri-state) encoding is known, where each pin has three possible values, namely high, low and mid. The electronic circuitry required to sense trinary levels is more complex than that required to sense binary levels, but often the extra complexity is outweighed by the reduced packaging costs in adopting trinary encoding. In particular, whereas four binary bits encodes sixteen possible values, four trinary bits encodes 81 possible values.

However, a disadvantage of conventional trinary encoding systems is that the encoding has a base of three, whereas most digital systems operate on a base of two (i.e. binary). This leads to undesirable technical complexities as well as difficulties for users not used to working to base three.

Accordingly, the invention seeks to provide an enhanced encoding which can provide more options than binary or trinary encoding, and is also compatible with existing systems.

SUMMARY OF THE INVENTION

An aim of the invention, as indicated above, is to provide an increased number of options for a given number of inputs.

The invention meets this aim by providing an apparatus and method enabling inputs based on a quaternary encoding derived from first and second (higher and lower) impedance connections to each of first and second (high and low) signal levels. This can provide high, pulled-up, pulled down and low values. The high and low values can be derived from low impedance connections to high and low potential sources, respectively, and the pulled-up and pulled-down signal values can be derived from higher impedance connections to the high and low potential sources, respectively. Where reference is made to high and low signal levels and high and low impedances, it should be understood that the adjectives "high" and "low" are being used in relative terms with respect to each other rather than as absolute terms.

Discrimination of the first and second (high and low) levels is performed in two phases. In a first phase a signal level at an input is detected. In a second phase the input is driven towards the inverse of the level detected in the first phase and the level is detected once more. A change in level indicates a high impedance connection to the potential source corresponding to the signal level detected in the first phase. No change indicates a low impedance connection to the potential source corresponding to the signal level detected in the first phase. In this manner four input levels for an input can be discriminated using binary level discriminating circuitry.

Thus, in accordance with the invention, a quaternary signal is derived by a by either a higher or a lower impedance connection to either a first or a second signal level source.

In accordance with a first aspect of the invention, there is provided an apparatus comprising at least one quaternary signal input and an input decoder for determining whether a quaternary encoded signal at the signal input is a high impedance high level signal, a low impedance high level signal, a high impedance low level signal or a low impedance low level signal.

In accordance with another aspect of the invention there is provided apparatus having at least one quaternary signal input for receiving a quaternary encoded signal selected from one of a high impedance high level signal, a low impedance high level signal, a high impedance low level signal and a low impedance low level signal, the apparatus comprising an input stage connected to the input, the input stage including:

an input buffer for sensing a high level signal or a low level signal at the input; and an output driver for selectively driving the signal input towards a selectable signal level, the output driver being connected to receive an inverted signal level formed by the inverse of a signal level sensed by the input buffer in a first phase of operation for driving the input in a second phase of operation towards the inverse signal level, whereby no change in signal level is indicative of the high signal level or the low signal level sensed in the first phase being the low impedance high level signal or the low impedance low level signal, respectively, and a change in signal level is indicative of the high level signal or the low level signal sensed in the first phase being the high impedance low level signal or the low impedance low level signal, respectively.

The invention also provides an integrated circuit comprising a plurality of quaternary signal inputs, each for receiving a quaternary encoded signal selected from one of a high impedance high level signal, a low impedance high level signal, a high impedance low level signal and a low impedance low level signal, the apparatus comprising an input stage connected to the input, the input stage including:

- an input buffer for sensing a high level signal or a low level signal at the input; and
- an output driver for selectively driving the signal input towards a selectable signal level, the output driver being connected to receive an inverted signal level formed by the inverse of a signal level sensed by the input buffer in a first phase of operation for driving the input in a second phase of operation towards the inverse signal level,
- whereby no change in signal level is indicative of the high signal level or the low signal level sensed in the first phase being the low impedance high level signal or the low impedance low level signal, respectively, and a change in signal level is indicative of the high level signal or the low level signal sensed in the first phase being the high impedance low level signal or the low impedance low level signal, respectively.

The invention further provides quaternary signal encoder comprising first, second, third and fourth terminals, the first terminal being connectable to a high potential source, the second terminal being connectable to a device input, the third terminal being connected via an impedance element to the second terminal and the fourth terminal being connectable to a low potential source, whereby a low impedance high level signal is selectable by connecting the first and second terminals, a high impedance high level signal is selectable by connecting the first and third terminals, a high impedance low level signal is selectable by connecting the third and fourth terminals and a low impedance low level signal is selectable by connecting the second and fourth terminals.

In accordance with another aspect of the invention, there is provided a method of inputting quaternary encoded signals comprising:

encoding a quaternary encoded signal by selectively generating one of a high impedance high level signal, a low impedance high level signal, a high impedance low level signal and a low impedance low level signal;

inputting the quaternary encoded signal to a quaternary signal input; and decoding the quaternary encoded signal by determining whether the signal is a high impedance high level signal, a low impedance high level signal, a high impedance low level signal or a low impedance low level signal.

The invention further provides a method of inputting quaternary signals to a circuit, the method comprising:

a) supplying to an input of the circuit an input signal selected from one of four quaternary encoded signals, namely a high impedance high level signal, a low impedance high level signal, a high impedance low level signal and a low impedance low level signal;

b) detecting a signal level at the input during a first phase;

c) in a second phase, driving the input towards a signal level opposite to that detected at the input during the first phase; and d) detecting a signal level at the input during the second phase, no change in signal level with respect to the first phase being indicative of high signal level or low signal level detected in the first phase representing a low impedance high level signal or low impedance low level signal, respectively, and a change in signal level with respect to the first phase being indicative of a high signal level or low signal level detected in the first phase representing a high impedance high level signal or high impedance low level signal, respectively.

The decoding of the quaternary input is performed in two phases, whereby in a first phase the decoder is operable to detect a signal level indicative of a high or a low level signal, and in a second phase it is operable to apply an inverse drive to the signal input and to detect a change in signal level as indicative of a high impedance signal.

An input stage preferably comprises a first buffer connected to an output of the input buffer for recording a signal level sensed by the input buffer in the first phase. The stored input value can be inverted for controlling the output driver in the second phase. The input stage can also comprise a second buffer for storing the output of the image buffer in the second phase. The stored values represent a binary decoding of the quaternary signals. Alternatively mapping logic can be provided for providing another mapping of the signal values stored in the first and second buffers.

Control logic is provided for supplying timing signals to the stores.

The circuit, for example an integrated circuit, can comprise a plurality of inputs and a plurality of input stages, a respective the input stage being connected to each input. The integrated circuit can, for example, be a microcontroller.

DESCRIPTION OF THE DRAWINGS

Particular illustrative embodiments of the invention will be described hereinafter with reference to the accompanying drawings in which:

FIG. 4 is a schematic diagram of an output buffer of the input stage of FIG. 1;

FIG. 5 is a schematic diagram of an input buffer of the input stage of FIG. 1;

DESCRIPTION OF THE PREFERRED EMBODIMENT

Figure 1:
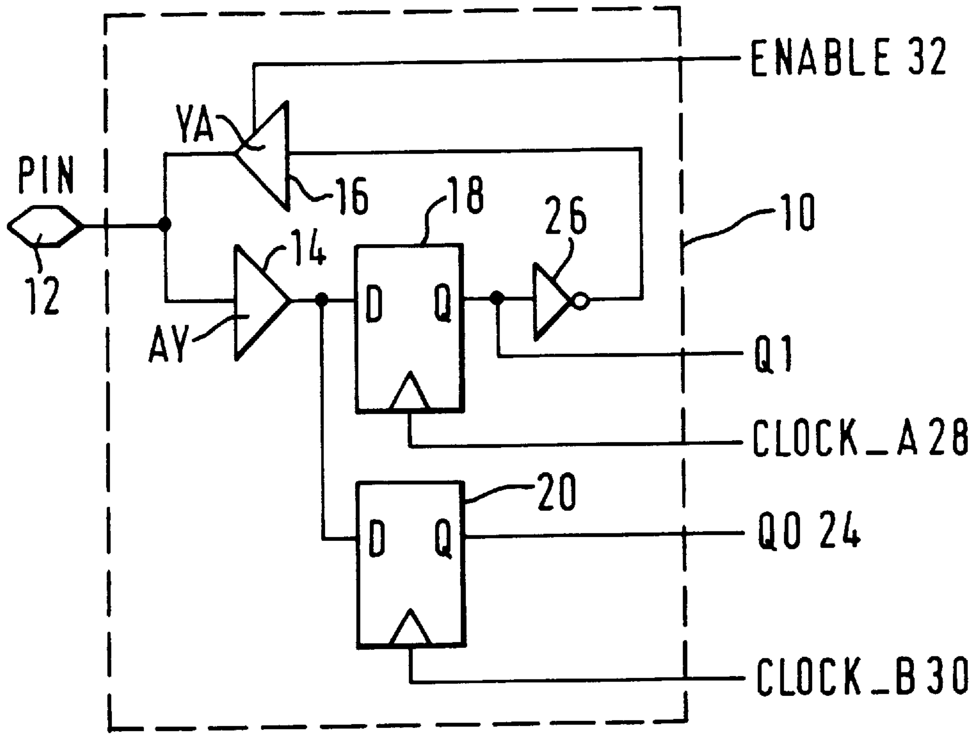
FIG. 1 is a schematic diagram of an embodiment of a quaternary input stage of an embodiment of the invention.

FIG. 1 is a schematic diagram of an embodiment of an input stage of apparatus employing quaternary encoding. With quaternary encoding, each pin may have four possible values. These values include:

High (H)—Driven high by a low impedance source, for example connected to a positive voltage supply line (VCC/VDD);

Pulled-Up (PU)—Driven high by a high impedance source, for example by a pullup resistor to a positive voltage supply line (VCC/VDD);

Pulled-Down (PD)—Driven low by a high impedance source, for example by a pullup (pulldown) resistor to a low supply rail (GND/VSS);

Low (L)—Driven low by a high impedance source, for example connected to a low supply rail (GND/VSS).

Accordingly, the pin 12 can have one of four possible values, H, PU, PD, L, as indicated above. The input stage illustrated in FIG. 1 enables discrimination between the four levels at the input source in two-phases. The input stage 10 includes an input buffer 14 having an input connected to the pin 12. An output of the input buffer 14 is connected to the data input of each of first and second data rising edge triggered registers 18 and 20. The Q output of the register 18 forms a first output 22 (Q1) of the input stage 10. The Q output of the second register 20 forms a second output 24 (Q0) of the input stage 10. The first and second registers 18 and 20 are clocked by clock signals CLOCK_A and CLOCK_B at clock inputs 28 and 30, respectively. The Q output of the register 18 is also supplied to the input of an inverter 26, the output of which is in turn supplied to the input of a low drive output buffer, or output driver 16. The output driver 16 is enabled by an ENABLE signal at an enable input 32. The output of the output driver 16 is connected to the pin 12 and also to the input of the input buffer 14.

Figure 2:
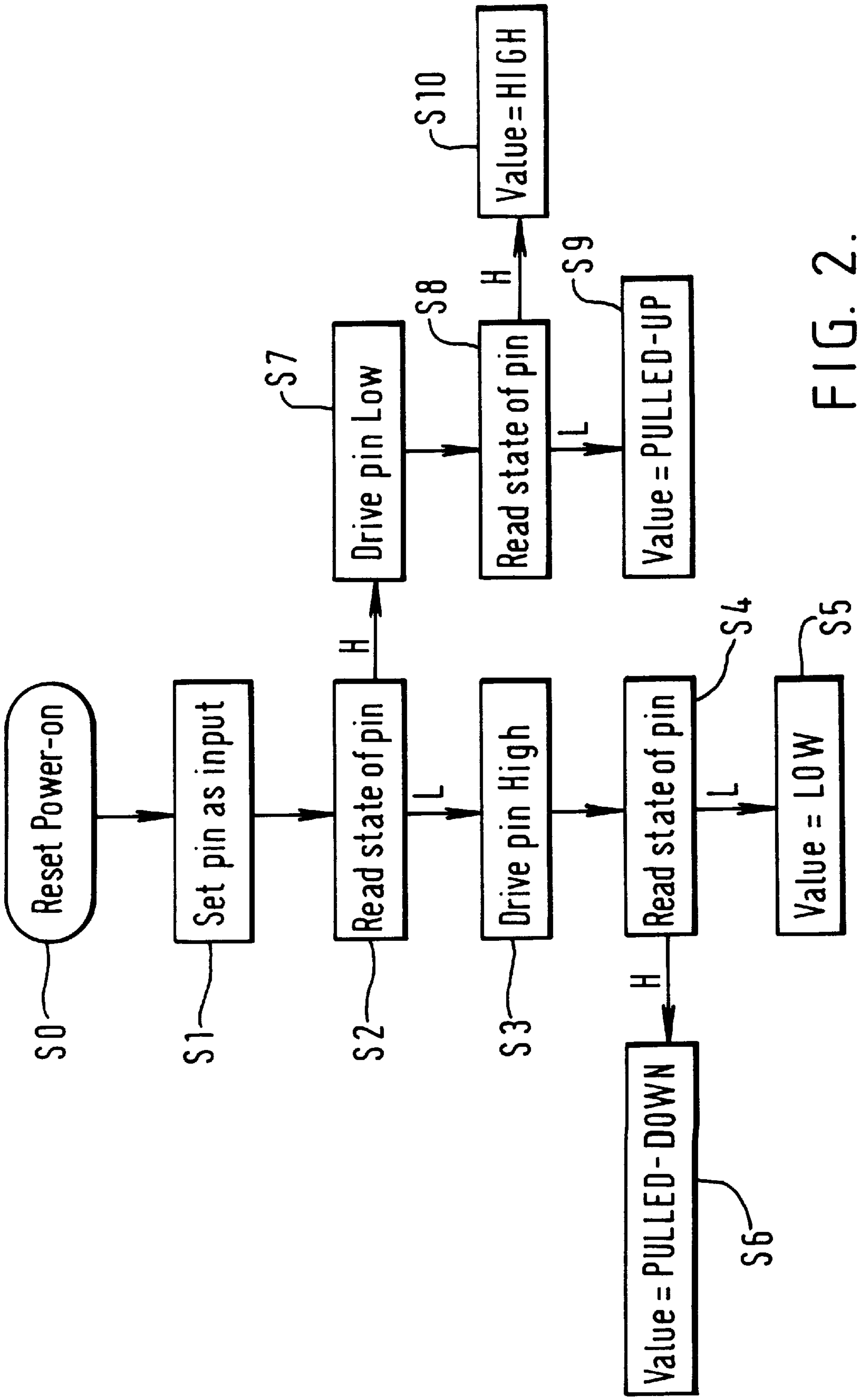
FIG. 2 is a flow diagram illustrating the operation of the input stage of FIG. 1.

FIG. 2 is a summary flow diagram illustrating the operation of the input stage 10 of FIG. 1.

Step S0 represents a reset/power-on state. Following this state, in step S1, the pin 12 is set as an input.

In a first phase, in step S2, the pin 12 is sensed by the input buffer 14 with the output driver 16 disabled (with the ENABLE signal low). The output of the input buffer 14 is provided to the D input of the registers 18 and 20. Register 18 is clocked by the rising edge of CLOCK_A. Register 20 is not clocked at this time. Shortly thereafter, the state of the pin 12 which has been read is available at the Q output of the register 18.

In a second phase, if the state of the pin read in phase 1 is low, then in step S3 the pin is driven high by supplying the ENABLE signal to the output driver 16 to enable that driver 16, and also supplying a high signal to the input of the output driver 16. The high signal at the input to the driver 16 is derived by inverting the low signal level at the output Q of the register 18 in the inverter 26.

In step S4, the state of the pin as detected by the input buffer 14 is captured by the rising edge of CLOCK_B so that the subsequent output from the input buffer 14 is stored in the register 20. At this time, if the pin can be driven high, then it must have a Pulled-Down input value. If it has a Low input value, then the relatively weak output driver 16 would not have been able to drive the pin high. Accordingly, if the value sensed is Low, it is concluded in step S5 that the input value at the pin is a Low value. Alternatively, if the value sensed is High, then it is concluded in step S6 that the input value at the pin is the Pulled-Down value.

Alternatively, if the state of the pin read in phase 1 is high, then in step S7 the pin is driven low by supplying the ENABLE signal to the output driver 16 to enable that driver 16, and also supplying a low signal to the input of the output driver 16. The low signal at the input to the driver 16 is derived by inverting the high signal level at the output Q of the register 18 in the inverter 26.

In step S8, the state of the pin as detected by the input buffer 14 is read by the rising edge of CLOCK_B, so that the subsequent output from the input buffer 14 is stored in the register 20. At this time, if the pin can be driven low, then it must have a Pulled-Up input value. If it has a High input value, then the relatively weak output driver 16 would not have been able to drive the pin low. Accordingly, if the value sensed is Low, it is concluded in step S9 that the input value at the pin is a Pulled-Up value. Alternatively, if the value sensed is High, then it is concluded in step S10 that the input value at the pin is the High value.

Figure 3:
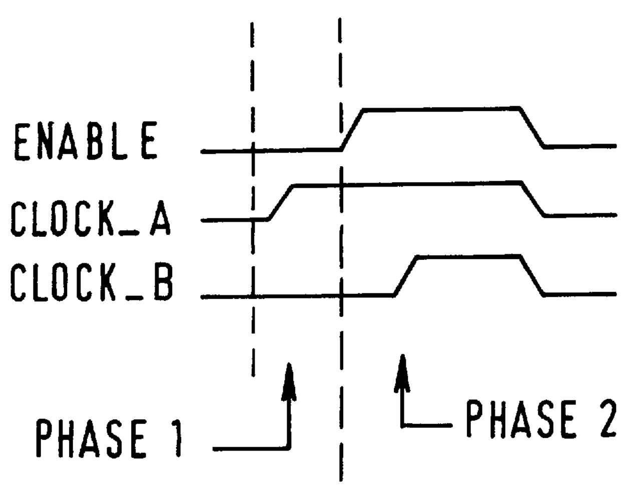
FIG. 3 is a timing diagram showing a relationship between signals in the input stage of FIG. 1.

FIG. 3 illustrates the timing of the ENABLE, CLOCK_A and CLOCK_B signals during the first and second phases described above. It will be seen that CLOCK_A has a rising edge in the first phase and CLOCK_B has a rising edge in the second phase. The ENABLE signal is set high towards the end of the first phase in order to initiate the second reading of the pin 12 when driven by the output buffer 16.

As described above, the signals Q0 and Q1 supplied at the outputs 24 and 22, respectively, indicate the value of the pin 12. The output values are summarised in the table below:

TABLE 1

| Q1 | Q0 | Pin |
|---|---|---|
| 0 | 1 | Low |
| 0 | 1 | Pulled-Down |
| 1 | 0 | Pulled-Up |
| 1 | 1 | High |

FIG. 4 is a schematic diagram illustrating an example of a circuit suitable for implementing the output driver 16. The circuit comprises a first CMOS drive transistor 40 and a second CMOS drive transistor 42 connected in series between a high potential source (e.g. a high potential rail 60) and a low potential source (e.g. a low potential rail 58). Between the first drive transistor 40 and the high potential source 60, a current limiter represented by a resistor 46 is provided. Between the second drive transistor 42 and the low potential source 58, a current limiter represented by a resistor 48 is provided. The current limiters 46 and 48 could be implemented using any appropriate technology, for example by providing CMOS constant current sources. Likewise, the drive transistors 40 and 42 could be implemented in any desired technology. In a preferred embodiment of the invention illustrated in FIG. 3, the first and second transistors are implemented by a PMOS and an NMOS field effect transistor, respectively.

The A input of the output driver 16 is connected to a NAND gate 50 and via an inverter 56 to an AND gate 52. The ENABLE input is connected to a second input of both the AND gate 52 and the NAND gate 50. The output of the NAND gate 50 is connected to the gate of the first driver transistor 40 and the output of the AND gate 52 is connected to the gate of the second driver transistor 42. The output Y of the output driver 16 is connected to the pin 12. The operation of the output driver 16 is that when a high signal is supplied at the input A and the ENABLE signal is high, a low signal is supplied to the input of the first (PMOS) drive transistor 42 causing the pin 12 to be driven high. A high signal is also output by the AND gate 52 causing the second (NMOS) drive transistor 42 to be turned off. When a low signal is provided at the input A and the ENABLE signal is high, a high signal is output by the AND gate 52 causing the second (NMOS) drive transistor 42 to be turned on. A high output is also supplied from the NAND gate 50 which causes the first (PMOS) transistor 40 to be turned off. As a result, the output Y of the output buffer, and consequently the pin 12, are driven low.

FIG. 5 is a schematic representation of an input buffer 14, which comprises a diode protection stage 62 between the high potential supply 60 and the low potential source 58 and an first and second CMOS inverters stages 63 and 64. The input buffer 14 can be implemented using any appropriate technology. In the present preferred embodiment, CMOS technology is used.

Figure 6:
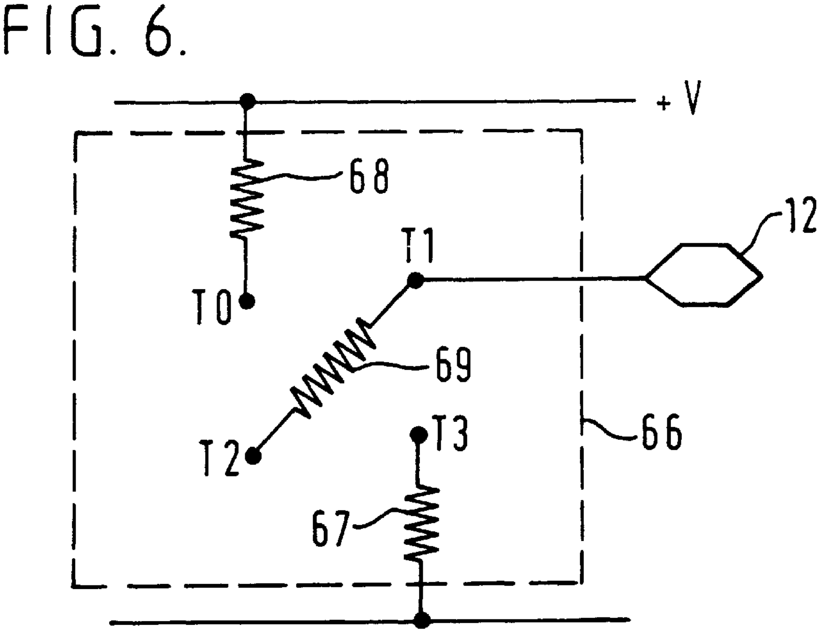
FIG. 6 is a jumper layout for an input to the input stage of FIG. 1.

FIG. 6 is a schematic representation of a jumper arrangement for determining the input value at the input pin 12. The jumper arrangement 66 provides a very compact arrangement for selecting one of four values using four input terminals. As shown in FIG. 6, the input arrangement comprises first terminal T0 which is connected to a high potential source 60. The connection to the positive supply rail 60 can be a direct connection, or can optionally include a resistor or low impedance element 68. A second terminal T1 is connected to the input pin 12. A third terminal T2 is connected to the terminal T1 by a resistor or high impedance element 69. A fourth terminal T3 is connected to the low potential source 58. The terminal T3 can be connected directly to the low supply rail 58, or could be optionally connected to the supply rail 58 via a resistor or low impedance element 67.

As indicated above, the resistor/impedance elements 67 and 68 are optional. Whether to include a resistor/impedance element 67 and 68 depends on the configuration of the output driver 16. If the current limiters 46 and 48 are implemented as, for example, 1 mA constant current sources, then a 100 ohm resistor could be used as the resistor/impedance elements 67 and 68. The resistor 68 could then be implemented by a 10 Kohm resistor to provide the Pulled-Up and Pulled-Down values. In order to achieve the H, PU, PD and L input values, a jumper is selectively connected between the combinations of terminals as indicated below:

TABLE 2

| Input value | Terminals Connected |
|---|---|
| High | T0-T1 |
| Pulled-Up | T0-T2 |
| Pulled-Down | T2-T3 |
| Low | T1-T3 |

It can be seen from the above table that a single jumper provided between a selected pair of the terminals can be used to provide one of the four input values in a very compact and readily understandable manner.

Figure 7:
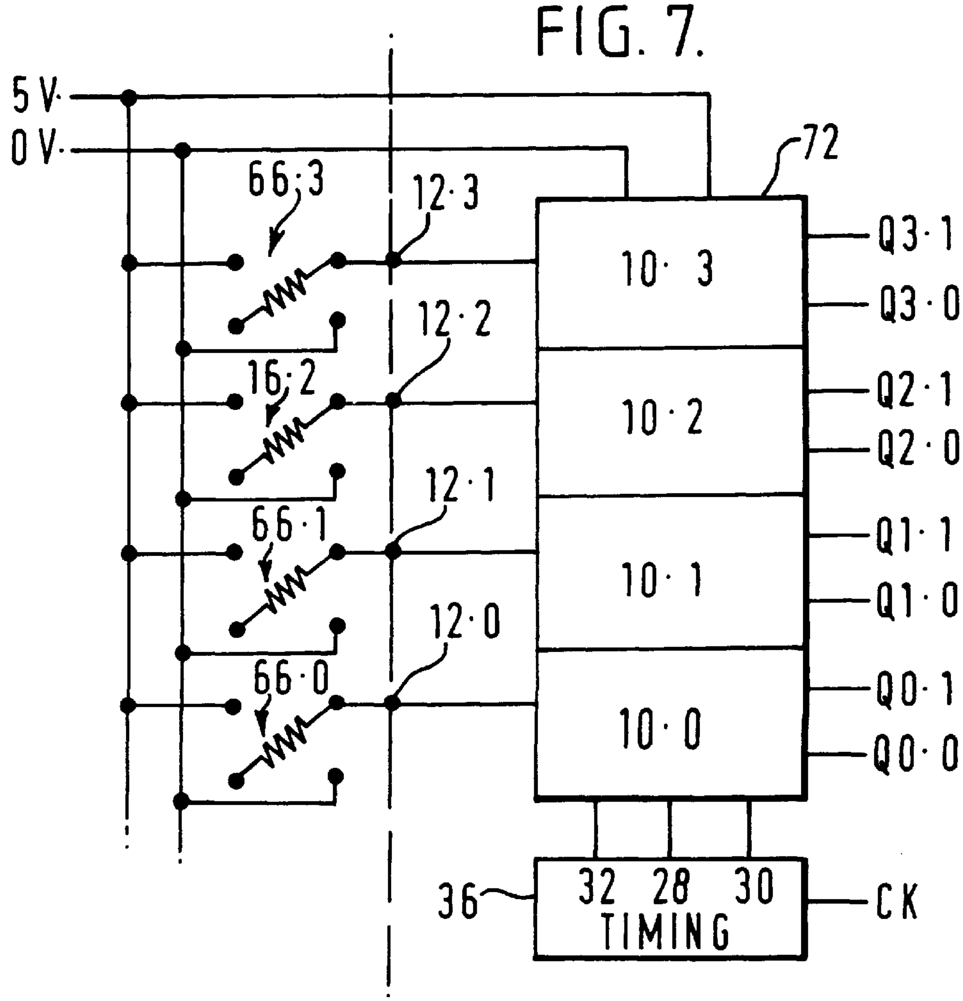
FIG. 7 is a schematic representation of an input apparatus having four inputs.

FIG. 7 is a schematic representation of an arrangement providing four input pins 12.0–12.3 with corresponding input buffer stages 10.0–10.3 and corresponding jumper terminal sets 66.0–66.3. An arrangement as described in FIG. 7 can provide $N^8$=256 independent outputs from four input pins. Accordingly, it can be seen that a high number of operations can be provided from a low number of pins. It will be appreciated that the benefit can be extended by having more input stages, each having a respective input pin.

The ENABLE, CLOCK_A and CLOCK_B inputs can be provided from a timing generator 36 which can be controlled by a system clock CK.

Figure 8:
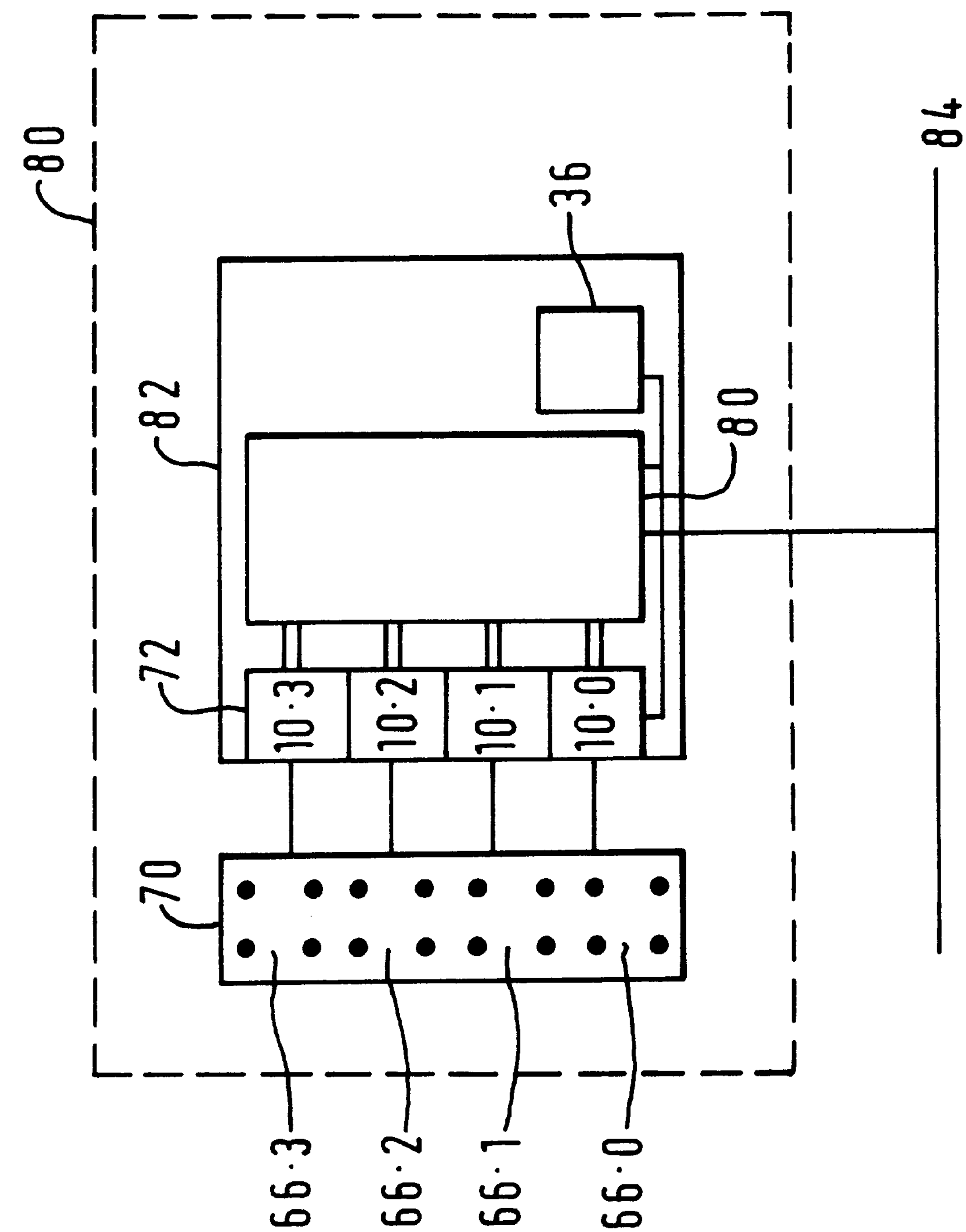
FIG. 8 is a schematic representation of a system employing input apparatus according to FIG. 7.

FIG. 8 is a schematic overview of a system incorporating an input arrangement as shown in FIG. 7. The system could, for example, comprise a controller 80 for controlling local equipment, the controller being connected to a communications medium 84. An array 70 of jumper terminals can be used for selecting an input address for address decoding circuitry 82 of the controller 80. The address circuitry 82 includes an input decoder 72 having a plurality of input stages corresponding to stages 10.0–10.3 of FIG. 7 and respective inputs for the respective groups of jumper pins 66. The address circuitry 82 can be responsive to a timing circuit 36 and can include further address circuitry 90 responsive to the input 72.

The address circuitry 82 can be connected to further circuitry within the controller 80 in order to achieve desired control functions, and can additionally be provided with input devices 86 and/or display devices, as appropriate.

The ENABLE, CLOCK_A and CLOCK_B can be driven by a timing control block 36 that can be common for each of the quaternary encoded input pins. The control block can be arranged to supply timing signals for evaluating the pins once, for example at power-on or reset, or may continuously evaluate the pins for a real-time input.

Although in the particularly described embodiments, the values supplied to the input pins 12 are derived from jumpers, in alternative embodiments of the invention this need not be the case. Indeed, any input selector may be used, for example a rotary switch, keys, hard wirings which can be selectively removed, etc. Moreover, although a particular configuration is shown for generating the quaternary inputs, other embodiments of the encoder could be implemented using other specific configurations.

Also, although in the embodiments described, four inputs with four input stages are provided, other embodiments may include other numbers of input pins and input stages, as appropriate. Although a communications controller has been illustrated as an example of an embodiment of the invention, other embodiments of the invention could include a microcontroller, a microcomputer or other integrated circuits or circuits.

Although particular embodiments of the invention have been described, it will be appreciated that the invention is not limited thereto, and many modifications and/or additions may be made within the spirit and scope of the invention as defined in the appended claims. For example, different combinations of the features of the dependent claims may be combined with the features of any of the independent claims.

What is claimed is:

1. Apparatus comprising at least one quaternary signal input and an input decoder for determining whether a quaternary encoded signal at said signal input is a high impedance high level signal, a low impedance high level signal, a high impedance low level signal or a low impedance low level signal, wherein said decoder is configured to be operable in two phases, wherein in a first phase said decoder is operable to detect a signal level indicative of a high or a low level signal, and in a second phase is operable to apply an inverse drive to said input and to detect a change in signal level as indicative of a high impedance signal.

2. Apparatus having at least one quaternary signal input for receiving a quaternary encoded signal selected from one of a high impedance high level signal, a low impedance high level signal, a high impedance low level signal and a low impedance low level signal, said apparatus comprising an input stage connected to said input, said input stage including:

an input buffer for sensing a high level signal or a low level signal at said input; and an output driver for selectively driving said signal input towards a selectable signal level, said output driver being connected to receive an inverted signal level formed by the inverse of a signal level sensed by said input buffer in a first phase of operation for driving said input in a second phase of operation towards said inverse signal level, whereby no change in signal level is indicative of said high signal level or said low signal level sensed in said first phase being said low impedance high level signal or said low impedance low level signal, respectively, and a change in signal level is indicative of said high level signal or said low level signal sensed in said first phase being said high impedance low level signal or said low impedance low level signal, respectively.

3. Apparatus according to claim 2, wherein said input stage comprises a first register connected to an output of said input buffer for recording a signal level sensed by said input buffer in said first phase.

4. Apparatus according to claim 3, comprising an inverter having an input connected to receive an output of said first register and an output connected for supplying said inverted signal level to said output driver.

5. Apparatus according to claim 4, wherein said output driver comprises an enable input, said apparatus comprising control logic supplying an enable signal to said output driver in said second phase.

6. Apparatus according to claim 5, wherein said control logic is configured to supply a first clock signal for clocking said first register in said first phase.

7. Apparatus according to claim 6, comprising a second register connected to an output of said input buffer, said control logic being configured to supply a second clock signal to said second register in said second phase to clock said second register for storing a signal level sensed by said input buffer in said second phase.

8. Apparatus according to claim 7, wherein the outputs of said second and first registers, respectively, form a binary decoding of said quaternary encoded input signal.

9. Apparatus according to claim 2, comprising a quaternary signal value encoder connected to said input.

10. Apparatus according to claim 9, wherein said quaternary signal value encoder comprises first, second, third and fourth terminals, said first terminal being connected to a high potential source, said second terminal being connected to said input, said third terminal being connected via an impedance element to said second terminal and said fourth terminal being connected to a low potential source, whereby said low impedance high level signal is selectable by connecting said first and second terminals, said high impedance high level signal is selectable by connecting said first and third terminals, said high impedance low level signal is selectable by connecting said third and fourth terminals and said low impedance low level signal is selectable by connecting said second and fourth terminals.

11. Apparatus according to claim 2, comprising a plurality of inputs and a plurality of input stages, a respective said input stage being connected to each input.

12. Apparatus according to claim 11, comprising control logic for supplying control signals to each input stage for timing said first and second phases.

13. Apparatus according to claim 2 in the form of an integrated circuit, wherein said input is a pin of said integrated circuit.

14. An integrated circuit comprising a plurality of quaternary signal inputs, each for receiving a quaternary encoded signal selected from one of a high impedance high level signal, a low impedance high level signal, a high impedance low level signal and a low impedance low level signal, said apparatus comprising an input stage connected to said input, said input stage including:

an input buffer for sensing a high level signal or a low level signal at said input; and an output driver for selectively driving said signal input towards a selectable signal level, said output driver being connected to receive an inverted signal level formed by the inverse of a signal level sensed by said input buffer in a first phase of operation for driving said input in a second phase of operation towards said inverse signal level, whereby no change in signal level is indicative of said high signal level or said low signal level sensed in said first phase being said low impedance high level signal or said low impedance low level signal, respectively, and a change in signal level is indicative of said high level signal or said low level signal sensed in said first phase being said high impedance low level signal or said low impedance low level signal, respectively.

15. An integrated circuit according to claim 14, wherein a said input stage comprises a first register connected to an output of said input buffer for recording a signal level sensed by said input buffer in said first phase.

16. An integrated circuit according to claim 15, wherein a said input stage additionally comprises a second register connected to an output of said input buffer for recording a signal level sensed by said input buffer in said second phase.

17. An integrated circuit according to claim 16, comprising control logic for supplying respective clock signals to said first and second registers for clocking said first and second registers during said first and second phases, respectively.

18. An integrated circuit according to claim 17, wherein a said input stage comprises an inverter having an input connected to receive an output of said first buffer and an output connected for supplying said inverted signal level to said output driver.

19. An integrated circuit according to claim 18, wherein said output driver of said input stage comprises an enable input for selectively enabling said output driver during said second phase, said control logic supplying said enable signal to said output driver in said second phase.

20. An integrated circuit according to claim 14, wherein the outputs of said second and first registers, respectively, of successive stages form a binary decoding of said quaternary encoded input signal.

21. An integrated circuit according to claim 14 in the form of a microcontroller.

22. A quaternary signal encoder comprising first, second, third and fourth terminals, said first terminal connected to a high potential source, said second terminal connected to a device input, said third terminal connected via an impedance element to said second terminal and said fourth terminal connected to a low potential source, whereby a low impedance high level signal is selectable by connecting said first and second terminals, a high impedance high level signal is selectable by connecting said first and third terminals, a high impedance low level signal is selectable by connecting said third and fourth terminals and a low impedance low level signal is selectable by connecting said second and fourth terminals.

23. A method of inputting quaternary encoded signals comprising:

encoding a quaternary encoded signal by selectively generating one of a high impedance high level signal, a low impedance high level signal, a high impedance low level signal and a low impedance low level signal;

inputting said quaternary encoded signal to a quaternary signal input; and decoding said quaternary encoded signal by determining whether said signal is a said high impedance high level signal, a said low impedance high level signal, a said high impedance low level signal or a said low impedance low level signal, wherein said decoder step comprises two phases, whereby in a first phase a determination is made as to whether the signal at the input is a high level signal or a low level signal, and in a second phase an inverse drive is applied to said input and a determination is made as to whether the signal level changes, a change in signal level being indicative of a high impedance signal and no change being indicative of a low impedance signal.

24. A method of inputting quaternary signals to a circuit, said method comprising:

a) supplying to an input of said circuit an input signal selected from one of four quaternary encoded signals, namely a high impedance high level signal, a low impedance high level signal, a high impedance low level signal and a low impedance low level signal;

b) detecting a signal level at said input during a first phase;

c) in a second phase, driving said input towards a signal level opposite to that detected at said input during said first phase; and d) detecting a signal level at said input during said second phase, no change in signal level with respect to said first phase being indicative of high signal level or low signal level detected in said first phase representing a low impedance high level signal or low impedance low level signal, respectively, and a change in signal level with respect to said first phase being indicative of a high signal level or low signal level detected in said first phase representing a high impedance high level signal or high impedance low level signal, respectively.

25. A method according to claim 24, wherein step (b) comprises storing said signal level detected in said first phase as a first bit.

26. A method according to claim 24, wherein step (c) comprises deriving a drive signal from the inverse of said signal level stored in step (b).

27. A method according to claim 25, wherein step (d) comprises storing said signal level detected in said second phase as a second bit.

28. A method according to claim 27, comprising a step of outputting a two-bit binary output from an input stage.

29. A method according to claim 24, wherein step (a) comprises selectively connecting said input to a high potential source via a low impedance connection for said low impedance high level signal, or to said high potential source via a high impedance for said high impedance high level signal, or to a low potential source via a low impedance connection for said low impedance low signal, or to said low potential source via a high impedance for said high impedance low level signal.

30. A method according to claim 29, wherein said selective connection is made by a jumper.

31. A method according to claim 24, wherein step (a) is performed prior to power-on or reset of said circuit and steps (b)–(d) are performed at power-on or reset of said circuit.

32. A method according to claim 31, wherein steps (b)–(d) are performed repeatedly following power-on or reset of said circuit.

* * * * *